US012559895B2

(12) United States Patent
Li et al.

(10) Patent No.: US 12,559,895 B2
(45) Date of Patent: Feb. 24, 2026

(54) SUBMERSIBLE DATA CENTER MOUNTABLE ON A SUBMERSIBLE PLATFORM

(71) Applicants: Kai Li, Singapore (SG); Xin Wang, Singapore (SG)

(72) Inventors: Kai Li, Singapore (SG); Xin Wang, Singapore (SG)

( * ) Notice: Subject to any disclaimer, the term of this patent is extended or adjusted under 35 U.S.C. 154(b) by 137 days.

(21) Appl. No.: 18/380,362

(22) Filed: Oct. 16, 2023

(65) Prior Publication Data

US 2024/0125078 A1     Apr. 18, 2024

(30) Foreign Application Priority Data

Oct. 14, 2022    (SG) ............................ 10202251385P

(51) Int. Cl.
    *E02B 17/08*        (2006.01)
    *H05K 7/20*         (2006.01)
(52) U.S. Cl.
    CPC .......... *E02B 17/08* (2013.01); *H05K 7/20763* (2013.01)
(58) Field of Classification Search
    CPC ......... E02D 29/06; E02B 17/04; E02B 17/08; E02B 17/0818; E02B 17/0872; B63B 35/44
    USPC .......................... 405/196, 197, 199, 200, 208
    See application file for complete search history.

(56) References Cited

U.S. PATENT DOCUMENTS 4,206,601 A * 6/1980 Eberle ................... F03B 13/186
                                                          60/497
4,473,256 A * 9/1984 Collins ................... E02F 9/062
                                                          173/28

8,853,872 B2   10/2014 Clidaras et al.
10,136,562 B2  11/2018 Kosugi et al.
10,285,309 B2   5/2019 James et al.
2008/0260467 A1* 10/2008 Kroecker ................. B63G 8/28
                                                          405/195.1

FOREIGN PATENT DOCUMENTS

CN        113216710 A  *  8/2021  ............ E02B 17/00
CN        114164855 A  *  3/2022
CN        114837478 A  *  8/2022
CN        117605086 A  *  2/2024
CN        117605087 A  *  2/2024
KR        102690654 B1 *  8/2024
WO        2020055330      3/2020

* cited by examiner

*Primary Examiner* — Frederick L Lagman
(74) *Attorney, Agent, or Firm* — Preston Smirman; SMIRMAN IP LAW, PLLC

(57) ABSTRACT

A submersible data center (180, 180a, 180b) configured in a water-tight capsule for deployment in a body of water. The data center capsules (180, 180a, 180b) are mounted on a submersible platform (110) of an elevator apparatus (100, 100a), which is equipped with a support leg (130a) or support legs (130) and winches (132) are located near a top of the support leg or each of the support legs. The data center capsules (180, 180a, 180b) can be submerged underwater for operation or be winched up above the water for retrieval/ maintenance. A first-time deployment of the support leg(s) (130, 130a) is provided by leg-lowering winches (112) located on the submersible platform (110). Heat exchangers (190) or chillers (190a) are used, or a centralized chiller (190b) is used, to dissipate heat energy from inside the data center capsules (180, 180a, 180b) to the surrounding water. Accompanying methods of operations are also described.

16 Claims, 12 Drawing Sheets

Electric Power Arrangements:

SUBMERSIBLE DATA CENTER MOUNTABLE ON A SUBMERSIBLE PLATFORM

CROSS-REFERENCE TO RELATED APPLICATION

The instant application claims priority to Singapore Patent Application Serial No. 10202251385P filed Oct. 14, 2022, the entire specification of which is expressly incorporated herein by reference.

FIELD OF THE INVENTION

The present invention relates to a submersible data center. The submersible data center is configured in a water-tight capsule or capsules and is/are mounted on a submersible platform of an elevator apparatus, which is being deployed in a body of water. The data center can thus be submerged under water for operation or be winched up above the water for retrieval or maintenance.

BACKGROUND OF THE INVENTION

A data center includes networks of electronic systems for remote storing, processing, and distributing of large amounts of data. As a result, a lot of heat is generated. Data centers housed on land use ventilation and air-conditioning systems. With fast-growing demand for cloud-based data services, the challenges for these data centers may be faster processing speeds, lower operating costs (including electric power consumption), security, and so on.

A National Environment Authority in Singapore did a study in 2012 on 23 data centers in Singapore and found that the average power usage effectiveness was 2.07. This indicates the total power requirements (cooling and IT load) are higher than other IT load by 107%. This points to inefficient electric power usage. Another study that year found the total electric power consumed by these data centers was 7.2% of Singapore's total electrical power consumption. The energy consumption rate of data centers is expected to increase to 12% by 2030, if conventional technologies continue to be used.

Ventilation and air-conditioning may make up half of the electricity consumption for operating a data center. Locating data centers in a body of water for cooling purposes or for using green energy produced in offshore farms have been sought. For example, U.S. Pat. No. 8,853,872 describes a floating platform or a ship carrying modular data centers, which are powered from electricity, produced by the motion of wave powered generators, and are cooled by cooling water pumped by wave-powered generators. The modular data centers may be configured in shipping containers.

In another approach, U.S. Pat. No. 10,136,562 describes a data center located in a housing member that is disposed under water. A heat exchanger discharges heat from the data center to the surrounding water. An opening is formed in a bottom face of the housing member and a liquid film covers a liquid surface of the water in the opening, through which a workman makes access into the housing member.

In another approach, U.S. Pat. No. 10,285,309 describes datacenter modules installed on the floor of a body of water. The data centers can also be anchored to the floor or be mounted on a platform that sinks to the floor of the body of water.

In yet another approach, patent publication WO2020/055330 describes a floating data center park serviced by a near-shore pier, a power supply module and chilled water pipes.

It can thus be seen that there exists a need for another type of underwater submersible data center that has advantages over known underwater systems. Desirably, this submersible data center is easy to deploy, operate and maintain.

SUMMARY OF THE INVENTION

The following presents a simplified summary to provide a basic understanding of the present invention. This summary is not an extensive overview of the present invention, and is not intended to identify key features of the invention. Rather, it is to present some of the inventive concepts of this invention in a generalized form as a prelude to the detailed description that is to follow.

The present invention seeks to provide a submersible data center capsule or data center capsules mountable on a submersible platform of an elevator apparatus. A plurality of the elevator apparatus can be organized together and the data center capsules are operable like a data center farm. In addition, some of the data center capsules may be used to support parallel supercomputing, data mining (including, crypto-currency mining), and so on.

In one embodiment, the present invention provides a submersible data center mountable on an elevator apparatus, as defined in the claims.

In another embodiment, the present invention provides a method for operating an underwater data center, as defined in the claims.

BRIEF DESCRIPTION OF THE DRAWINGS

This invention will be described by way of non-limiting embodiments of the present invention, with reference to the accompanying drawings, in which.

DETAILED DESCRIPTION OF THE INVENTION

One or more specific and alternative embodiments of the present invention will now be described with reference to the attached drawings. It shall be apparent to one skilled in the art, however, that this invention may be practiced without such specific details. Some of the details may not be described at length so as not to obscure the present invention.

Figure 1:
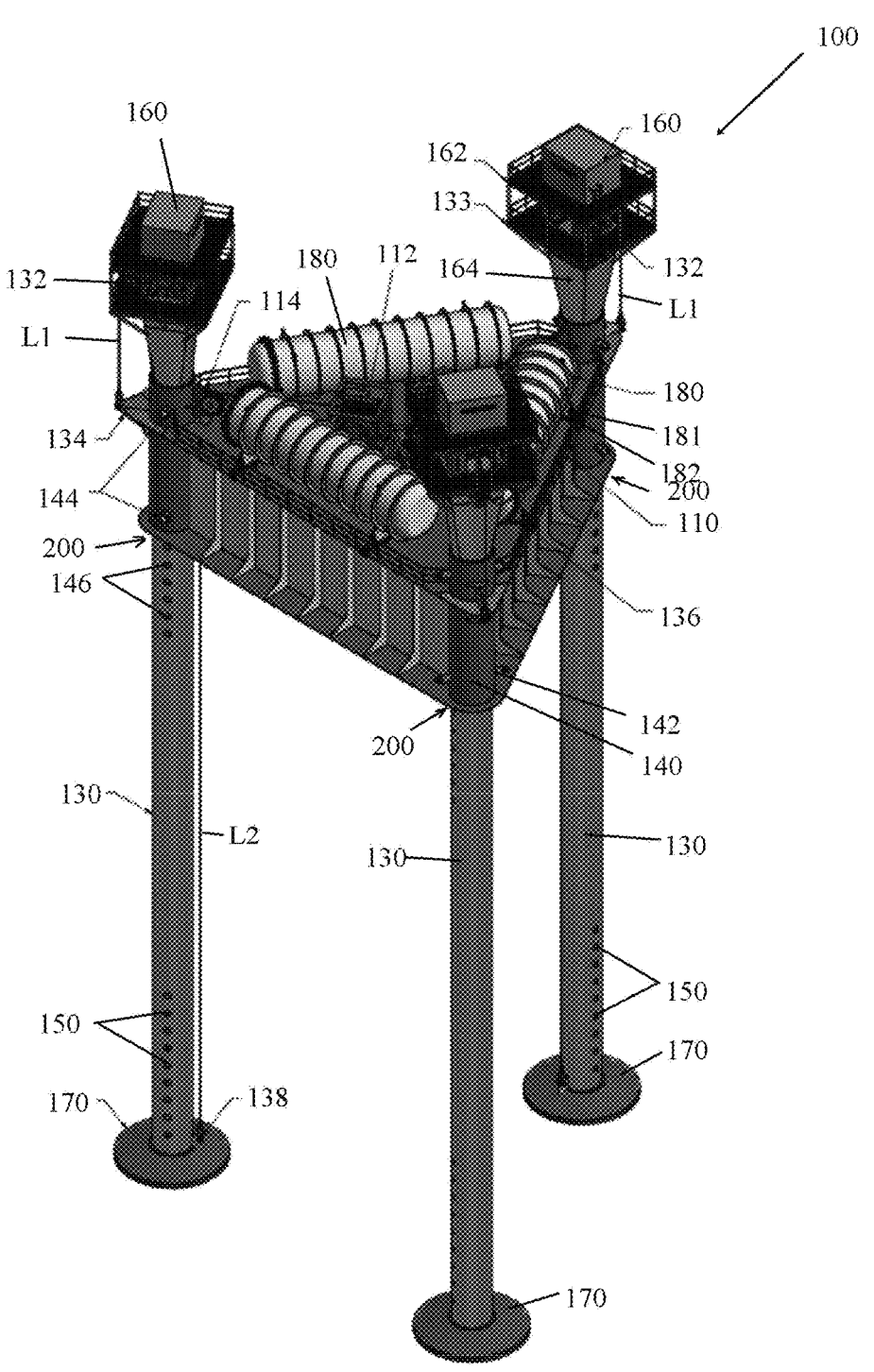
FIG. 1 illustrates a perspective schematic view of a submersible data center located on a submersible platform of an elevator apparatus, according to the general teachings of the present invention.
Figure 2:
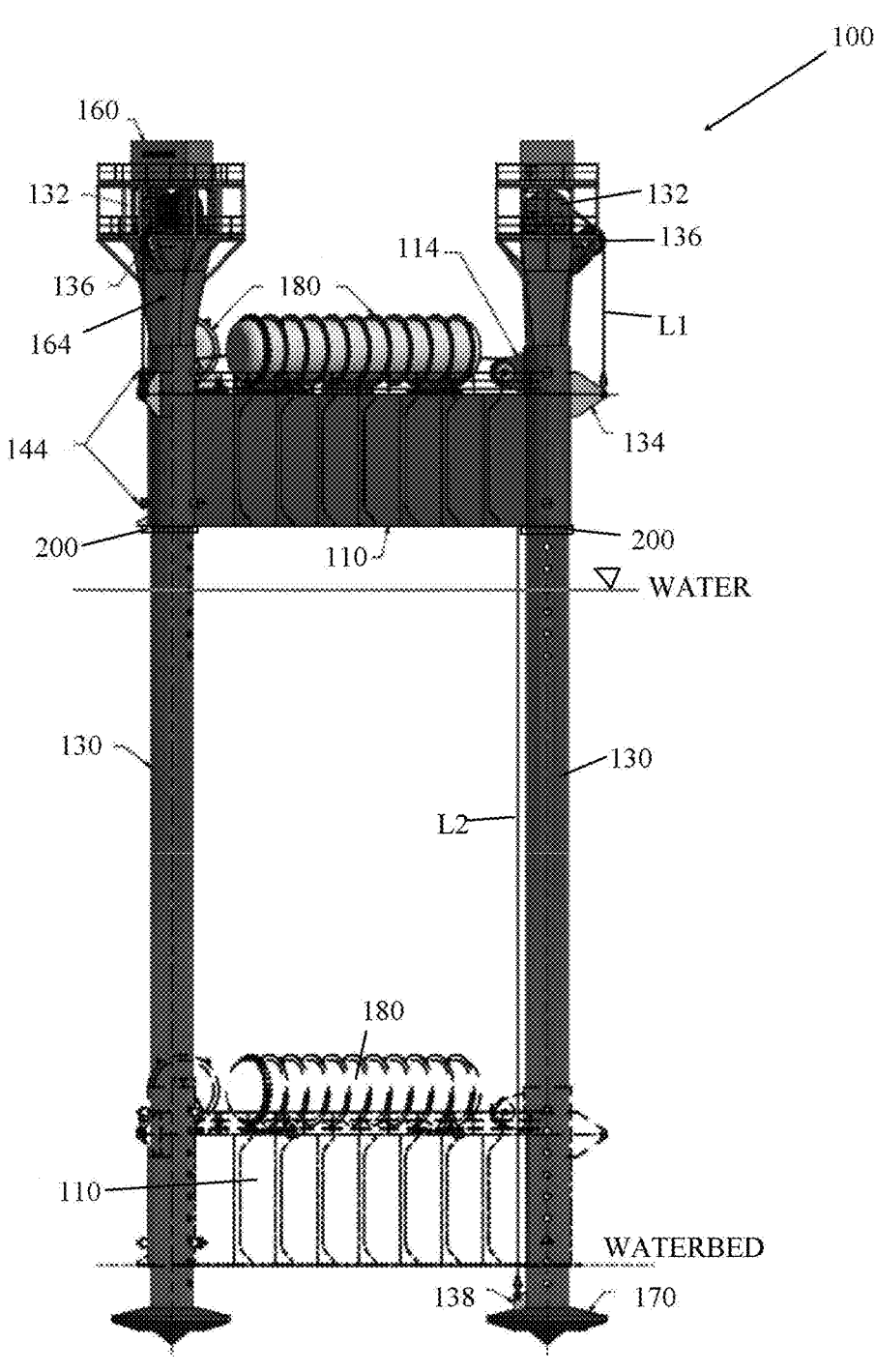
FIG. 2 illustrates an elevational schematic view of the submersible data center located on the submersible platform of the elevator apparatus depicted in FIG. 1.

FIGS. 1-2 show an elevator apparatus 100 in which a plurality of underwater data centers 180 are mounted on a submersible platform 110. These data centers 180 are configured in water-tight capsules, which allow modularity and portability. For illustration, 3 data center capsules 180 are shown in FIG. 1. The submersible platform 110 is supported on 3 support legs 130 after the elevator apparatus 100 is being deployed in a body of water. The submersible platform 110 is operable to slide relative to the support legs 130 by winches 132 mounted on top of each support leg 130. Located above each winch 132, is a power generator 160 to supply electric power to the elevator apparatus 100, the data centers 180, winches 132, lightings, associated control panels and so on. During operation, the top parts of the support legs 130, the winches 132 and the power generators 160 are located above a water level, as shown in FIG. 2. The distal end of each of the support leg 130 terminates with a spudcan 170, so that the spudcans 170 with an enlarged sectional area can settle or be embedded stably in a waterbed at the bottom of the body of water to support the entire elevator apparatus 100 after installation. It is possible that this elevator apparatus 100 can be moved or relocated to a new site for re-installation, if there is such a need.

Figure 19:
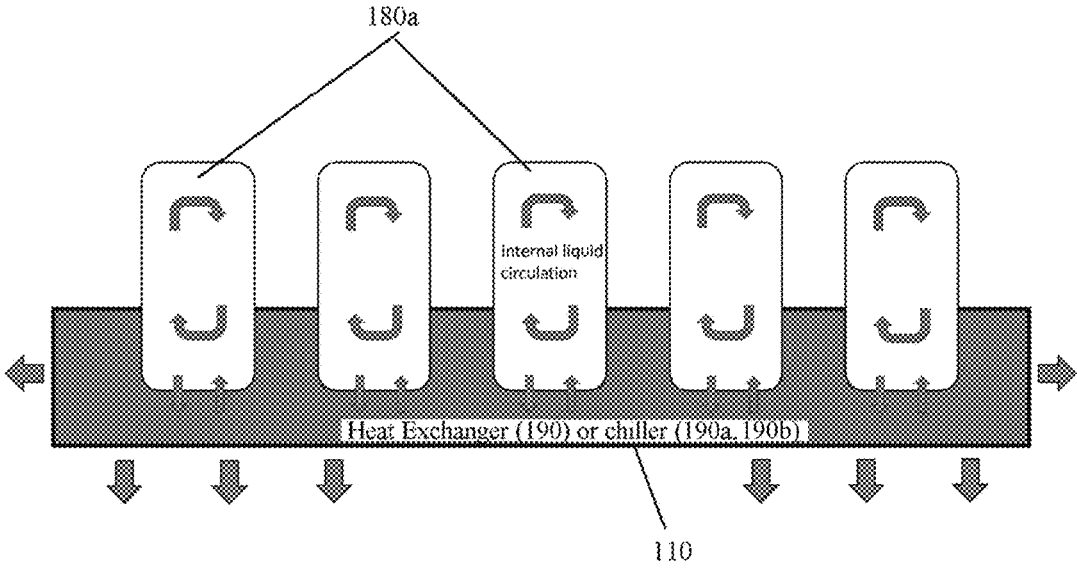
FIG. 19 illustrates a schematic view of a heat-exchange between a data center and water inside and outside the submersible platform.

The submersible platform 110 is fabricated from plates to form a substantially outer box-shaped structure and a hollow, interior structure. The hollow, interior may form buoyancy or ballast tanks. These tanks may be equipped with pumps and can be flooded with water for ballasting, water can be discharged for raising the submersible platform or to create water flow for dissipating heat energy with a heat exchanger 190 (as seen in FIG. 19). Sleeves 140 forming part of the submersible platform around the support legs allow the submersible platform 110 to slide relatively to the support legs 130. In other embodiments, wear or bearing strips (not shown in the figures) are located in the sleeves 140 to provide smoother sliding motion. It is also possible to provide a lower part of each of the sleeves 140 with a tapered surface slot 232, 232a and a matching wedge member 233, 233a connected to a linear actuator 235, 235a. The assembly of the sleeve 140 with tapered surface slot, matching wedge member and linear actuator provide failsafe brake mechanisms 200, 200a to stop relative sliding of the submersible platform 110 on the support legs 130 during an abnormal event. The fail-safe brakes 200, 200a may operate in conjunction with a motion sensor or motion sensors 324 to monitor normal sliding speed of the sleeves 140 on the support legs 130. The fail-safe brakes 200, 200a will be further described in FIGS. 21-23. Referring back to FIGS. 1-2, the submersible platform 110 is located removably onto the support legs 130 by locating pins 144 at two levels or positions—above water and at a submerged level. This is more clearly seen in FIG. 2. The locating pins 144 go through holes 142 formed on the sleeves 140 and locating holes 146, 150 formed on the support legs 130, so that the submersible platform 110 is connectable to the support legs 130 at either of the two levels. A range of the locating holes 146, 150 are provided to allow for varied settling or embedding of the spudcans 170 into the waterbed.

Figure 3:
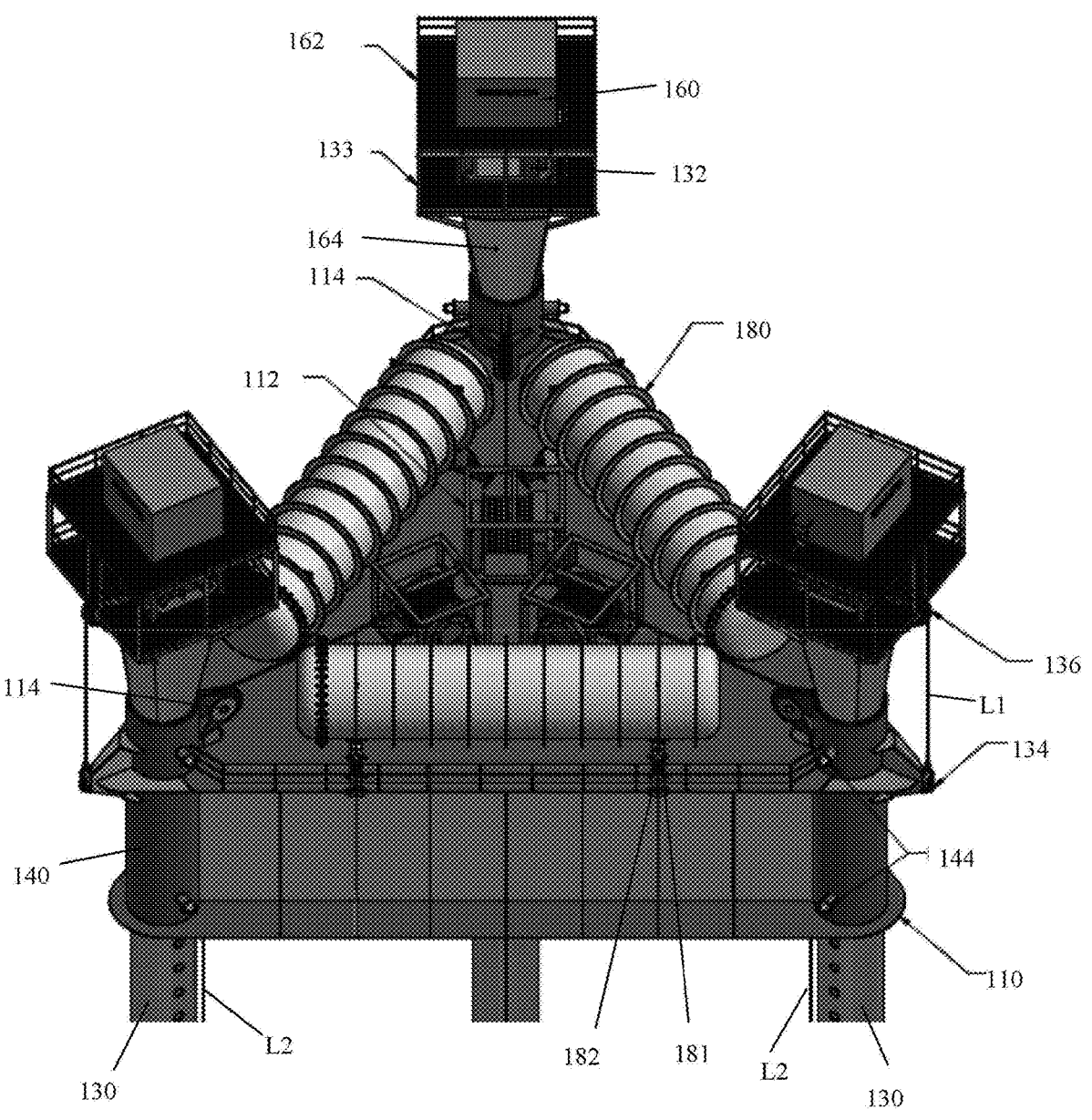
FIG. 3 illustrates an elevational schematic view of an upper part of the submersible platform depicted in FIG. 1.
Figure 4:
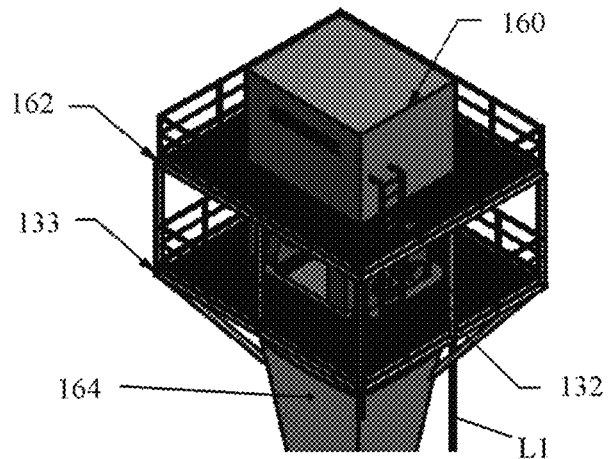
FIG. 4 illustrates a perspective schematic view of an upper part of the elevator apparatus depicted in FIG. 1.
Figure 5:
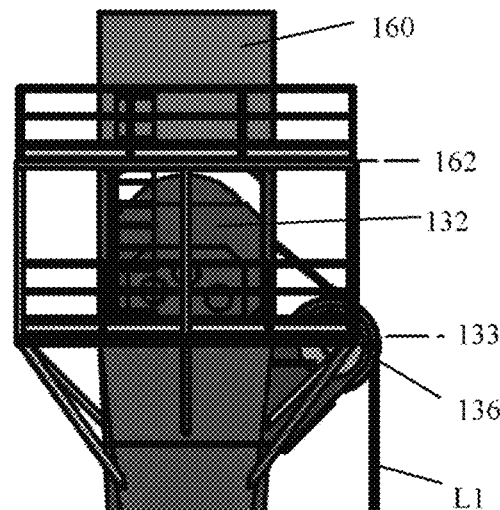
FIG. 5 illustrates an elevational schematic view of the upper part of the elevator apparatus depicted in FIG. 1.

Located on the submersible platform 110 are 3 leglowering winches 112. This is more clearly shown in FIG. 3, and the numbers of leg-lowering winches 112 match the number of support legs 130. The leg-lowering winches 112 are used only once for deploying the support legs 130 after the elevator apparatus 100 has been towed to the installation site. As seen in FIGS. 1-3, wire ropes L2 from the leglowering winches 112 pass through each associated sheave block 114 before terminating at a padeye 138 located near the distal end of each of the support legs 130. Each wire rope L2 is selected to withstand safely more than the weight of each support leg 130. Back to the winch 132 located at the top of the support legs, the associated wire ropes L1 pass through each associated winch sheave 136 before terminating at a padeye 134 located on the submersible platform 110. Each wire rope L1 is selected to withstand safely more than the weight of the weight of the submersible platform 110. For access, each of the winches 132 and generators 160 are equipped with a respective service platform 133, 162, and this is more clearly shown in FIGS. 4-5.

Figures 6, 7, 8:
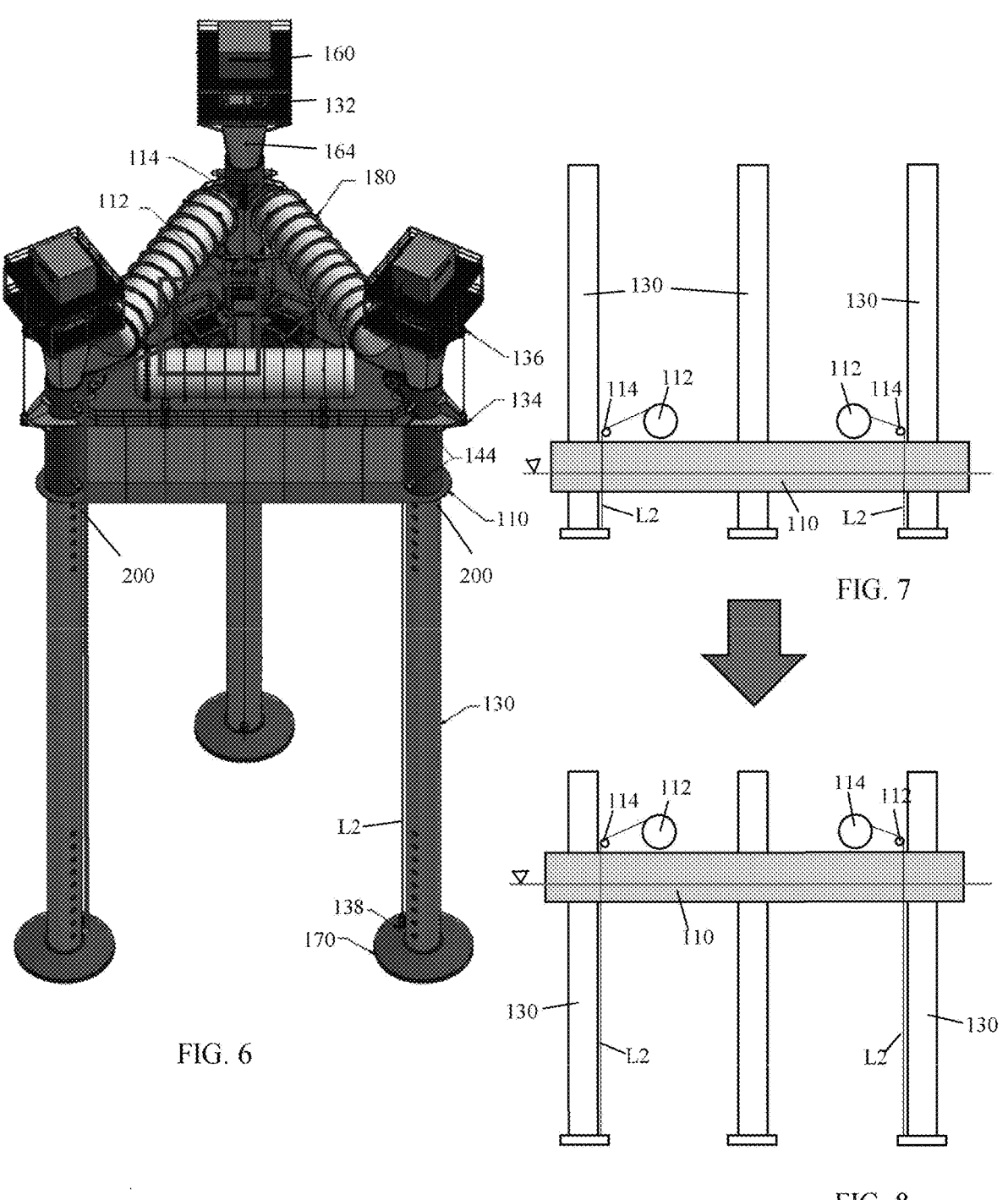
FIG. 6 illustrates a perspective schematic view of a first-time deploying of the elevator apparatus at an installation site in a body of water.
FIG. 7 illustrates a schematic view of the elevator apparatus deployed at an installation site in a body of water at a first position.
FIG. 8 illustrates a schematic view of the elevator apparatus deployed at an installation site in a body of water at a second position.

FIG. 6 shows another view of the elevator apparatus 100 with the submersible platform 110 being located near the top of the support legs 130. FIG. 7 schematically shows a first-time deploying of the support legs 130 after the elevator apparatus 100 is towed to the installation site, with the support legs 130 remaining extended substantially above the submersible platform, whilst the submersible platform 110 is floating on the water. To lower or deploy the support legs 130, the leg-lowering winches 112 release the wire ropes L2 and allow the support legs 130 to lower down to the waterbed in a controlled manner. After the leg-lowering winches 112 have released the support legs, deadweights of the support legs cause the spudcans 170 to lodge into the waterbed, as can be visualized from FIG. 8. From this point onwards, the leg-lowering winches 112 are no longer required. It is possible that the leg-lowering winches 112 are disabled or arranged to be dismantled from the elevator apparatus 100, so as to accommodate additional data center capsules 180. During the first-time deploying of the support legs, electric power is supplied from a barge that has towed the elevator apparatus 100 to the installation site, as indicated in FIG. 12, or from a separate power supply barge.

Figures 9, 10, 11:
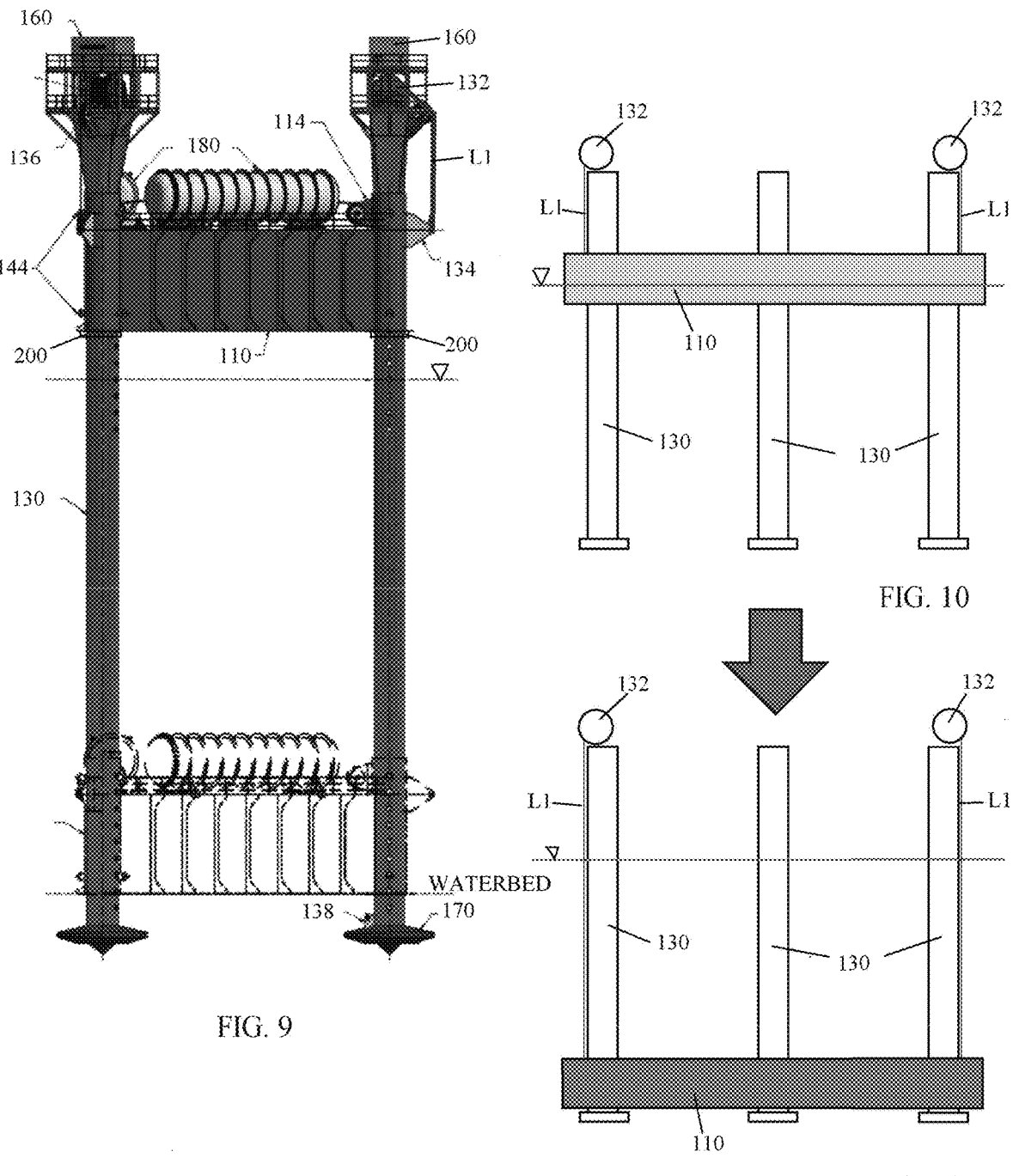
FIG. 9 illustrates an elevational schematic view of the submerging of the submersible platform in the body of water after the first-time deployment.
FIG. 10 illustrates a schematic view of the submerging of the submersible platform in the body of water after the first-time deployment at a first position.
FIG. 11 illustrates a schematic view of the submerging of the submersible platform in the body of water after the first-time deployment at a second position.

After the spudcans 170 have settled stably into the waterbed, the generators 160 located at the top of the support legs 130 are operated to supply electric power to the elevator apparatus 100. Inside an upper part of each support leg 130, a compartment 164 is provided to store fuel for the respective generator 160. To ensure further stability of the spudcans on the waterbed, the winches 132 are operated to elevate the submersible platform 110 partially or completely above the water level. This helps to preload or to expedite the spudcans 170 settle stably into the waterbed. FIG. 9 shows the support legs 130 after settling into the waterbed and the submersible platform 110 is winched above the water level. To lower down the submersible platform 110 to an operation position, schematic FIGS. 10-11 show the winches 132 release the wire ropes L1 in a controlled manner to submerge the submersible platform 110 into the body of water. In addition, water may also be pumped into the ballast tanks formed inside the submersible platform 110 to sink the submersible platform. After, the submersible platform 110 has reached the second level or position at the lower ends of the support legs 130; the locating pins 144 are put into place to locate the submersible platform to the support legs 130. When the data center capsules 180 are scheduled to be floated up, the reverse processes of removing the locating pins 144, winching up the submersible platform 110 and releasing the ballast water are carried out until the submersible platform 110 reaches the first level or position near the top of the support legs 130. The locking pins 144 are then put into place to locate the submersible platform 110 onto the support legs 130 at the first level.

Figure 12:
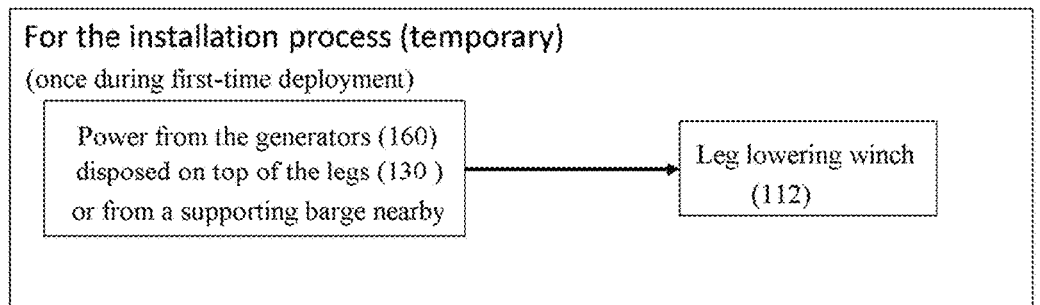
FIG. 12 illustrates a first schematic view of the use of power arrangements during the first-time deployment, launching of the elevator apparatus and operating the data center.
Figure 13:
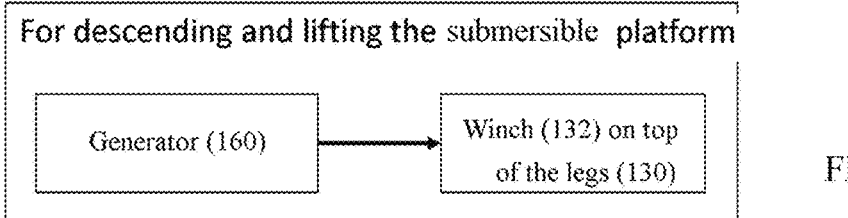
FIG. 13 illustrates a second schematic view of the use of power arrangements during the first-time deployment, launching of the elevator apparatus and operating the data center.
Figure 14:
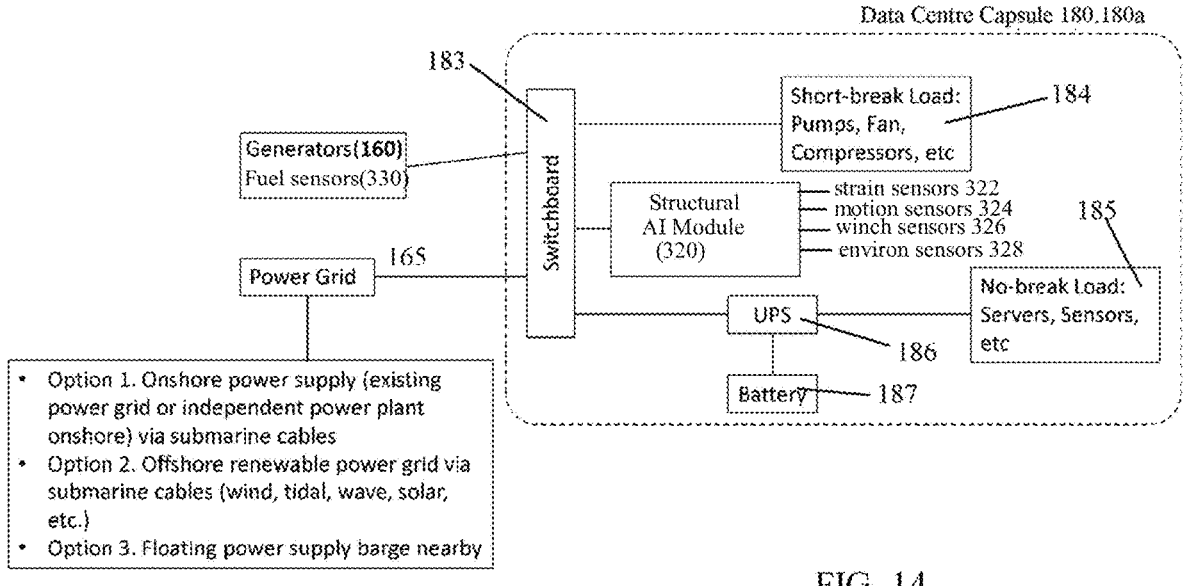
FIG. 14 illustrates a third schematic view of the use of power arrangements during the first-time deployment, launching of the elevator apparatus and operating the data center.

As described above, during initial, first-time deployment of the support legs 130, the barge supplies electric power to operate the leg-lowering winches 112 until after the elevator apparatus 100 is stably supported on the waterbed, as seen in FIG. 12. FIG. 13 shows that after the elevator apparatus 100 is stably installed at the site, the power generators 160 are operated to supply electric power, for example, to operate the winches 132, associated controls and so on, through a control board (not shown in the figures). In other embodiments, it is possible that after installation of the elevator apparatus 100, the data center capsules 180 are powered from an onshore power supply (for example, via submarine cables) through a grid connection 165. It is also possible to supply green energy to the elevator apparatus 100 from an offshore farm operable by solar power, wind, tides and/or wave forces, as seen in FIG. 14. It is also possible that the power generators 160 are employed to power the data center capsules 180, 180a for an interim period during an emergency operation when the onshore or offshore power supply is interrupted.

FIG. 14 further shows a short-break load connection 184 and a non-short-break load connection 185 from a switchboard 183 located inside each data center capsule 180. The short-break load connection supplies electric power to components (such as, fans, pumps, compressors, etc.) that can be temporarily interrupted, for example, for substantially 5-15 minutes. The non-short-break load connection 185 supplies power to servers and equipment via an uninterrupted power supply (UPS) 186 and a battery 187. In practice, multiple UPS 186 and batteries 187 are provided, for e.g., for hot swapping or redundancy or fail-safe operation.

Figure 15:
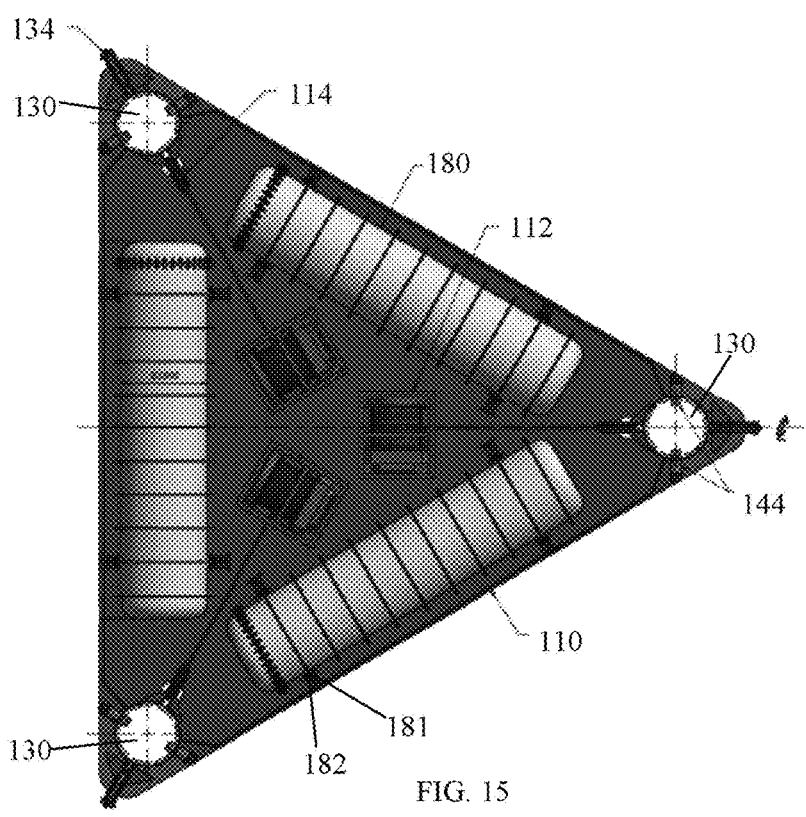
FIG. 15 illustrates a first schematic view of a way of arranging the data center capsules on the submersible platform.
Figure 16:
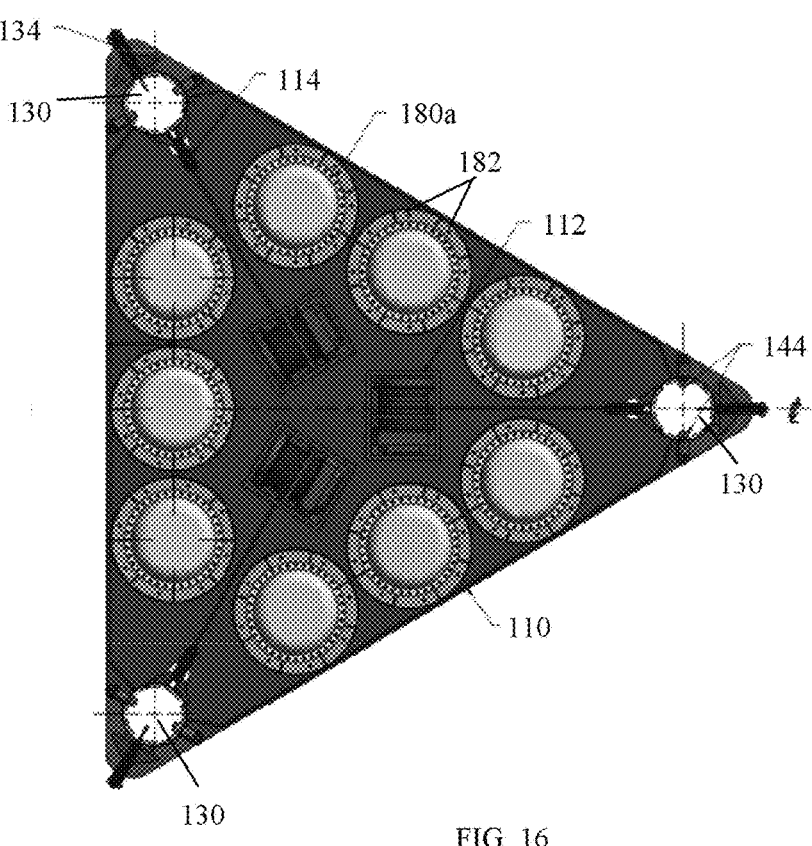
FIG. 16 illustrates a second schematic view of a way of arranging the data center capsules partially inside the submersible platform.
Figure 17:
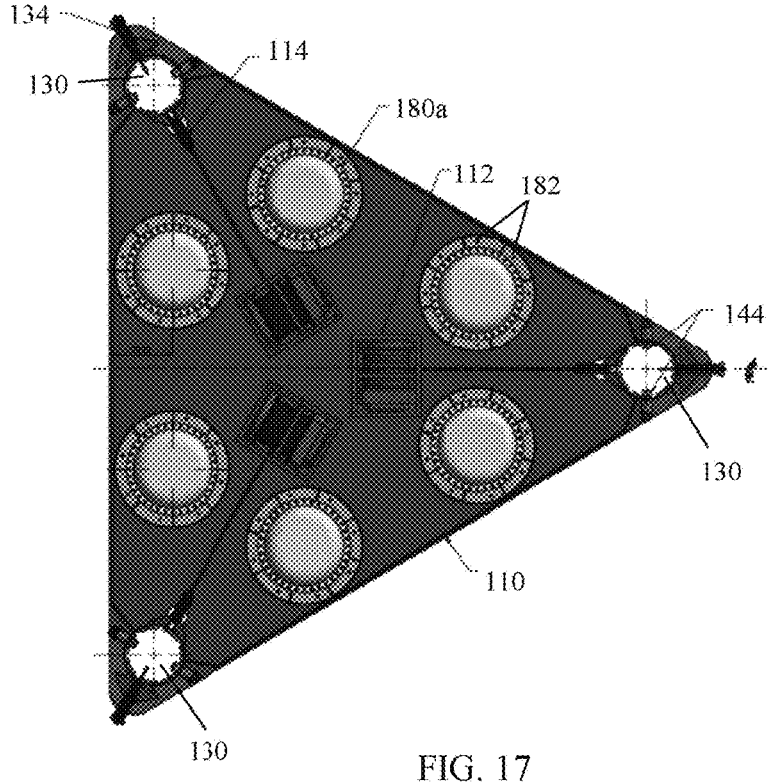
FIG. 17 illustrates a third schematic view of a way of arranging the data center capsules partially inside the submersible platform.

FIGS. 15-17 show various ways of configuring the data center capsules 180, 180a on the submersible platform 110. In FIG. 15, the data center capsules 180 are mounted onto the submersible platform, substantially horizontally, for example, on pedestals 181 with removeable fixing connectors 182 including screws, bolts and nuts, clamps and so on. In FIGS. 16-17, the data center capsules 180a are mounted substantially vertically and partially embedded into the submersible platform 110, for example, again with removable fixing connectors 182, including screws, bolts and nuts, clamps and so on. These removable fixing connectors 182 allow the data center capsules 180, 180a to be removed, for example, for replacement or for maintenance. As described above, the data center capsules 180, 180a are located in water-tight capsules. Preferably, these capsules have generally convex surfaces and are not restricted by the shapes illustrated in the figures. Other shapes can be part-dome, part-spherical or part-oval, to capitalize on compression stresses induced on such capsules when being submerged under-water. The data center capsules 180, 180a are also selected with substantially streamlined profiles or being arranged so as to reduce wave force loadings.

Figure 18:
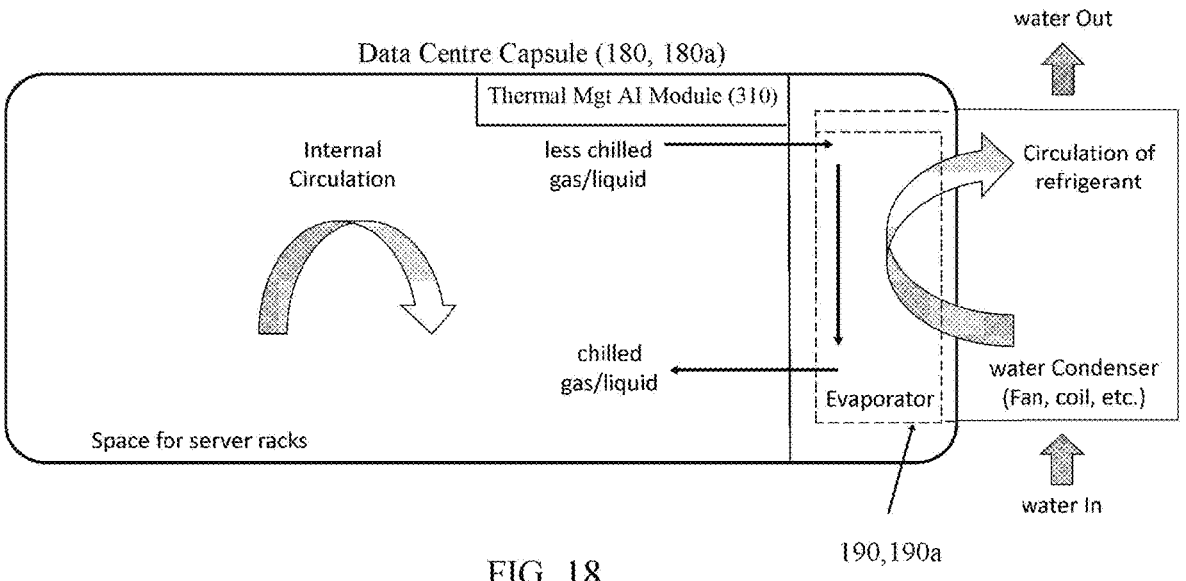
FIG. 18 illustrates a schematic view of an intended use of a heat-exchanger or chiller to dissipate thermal energy from a data center to the surrounding.

FIG. 18 shows a use of the heat exchanger 190 connected to a data center capsule 180, 180a to dissipate heat from inside the data center capsule to the surrounding body of water. The heat exchanger 190 includes fan coils that recirculate air inside the data center capsules 180, 180a and exchanging heat energy through coils and water pumps to the surrounding water. In another embodiment, a refrigerated chiller unit 190a is used to cool each data center capsule 180, 180a. The refrigerated chiller unit 190a includes an evaporator located inside a part of the data center capsule 180, 180a and a condenser located outside the data center. Refrigerant transfers heat from inside the data center capsule through the evaporator and condenser, and discharges the heat to the surrounding water. It is possible that the insides of the data center capsules are filled with nitrogen, a gas and not just air for cooling the equipment contained therein. It is also possible that heat sinks are mounted directly on the data center equipment and heat is dissipated away by convection of nitrogen, gas or air to the fan coil of the heat exchanger 190 or chiller 190a, thus providing direct cooling at the mounted heat sinks. It is also possible that server racks and the data center equipment inside the data center capsules are mounted on cold plates which are supplied internally with a dielectric cooling fluid (such as that supplied by Fluorinert Electronic Liquid, glycol, water, hydrocarbon fluid, etc.), which dielectric cooling fluid is then thermally connected to the heat exchanger 190 or chiller 190a to provide another form of direct cooling.

Figure 20:
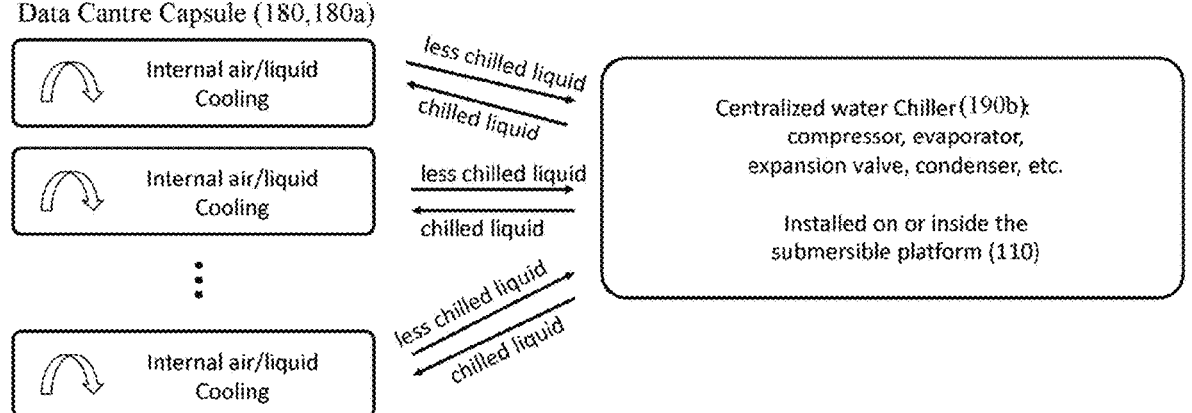
FIG. 20 illustrates a schematic view of a centralized chiller cooling system.

When the data center capsules 180a are located partially inside the submersible platform 110 (as seen in FIGS. 16-17), FIG. 19 shows an arrangement of the heat exchangers 190 exchanging heat energy with the water inside the submersible platform 110. Pumps may circulate the water inside the submersible platform 110 with cooler surrounding water, as schematically shown by arrows in FIG. 19. In another embodiment, chillers 190*a* are used to transfer heat from inside the data center capsules to the surrounding water. In yet another embodiment, a centralized chiller 190*b* is used, as illustrated in FIG. 20. Chilled fluid (such as, water) is supplied through a supply pipe to each data center capsule 180, 180*a* and heat is transferred out through a return pipe to the centralized chiller 190*b*.

With the above elevator apparatus 100, the data center capsules 180, 180*a* can be deployed in any body of water, including a lake, river, sea or ocean. An advantage of deploying the data center capsules below the water is to dissipate heat energy to a large body of water. The elevator apparatus 100 allows quicker deployment for operating the data center capsules or quicker retrieving of the data center capsules (for operation or maintenance) than known underwater systems. Operating the data center capsules at a depth near the waterbed provides additional access security. In addition, in some installations, water currents near the waterbed may be calmer. It is also possible to provide surveillance cameras above and/or underwater to provide additional access security. Deploying the data center capsules 180, 180*a* to a body of water also frees up valuable land for other uses.

Figure 21:
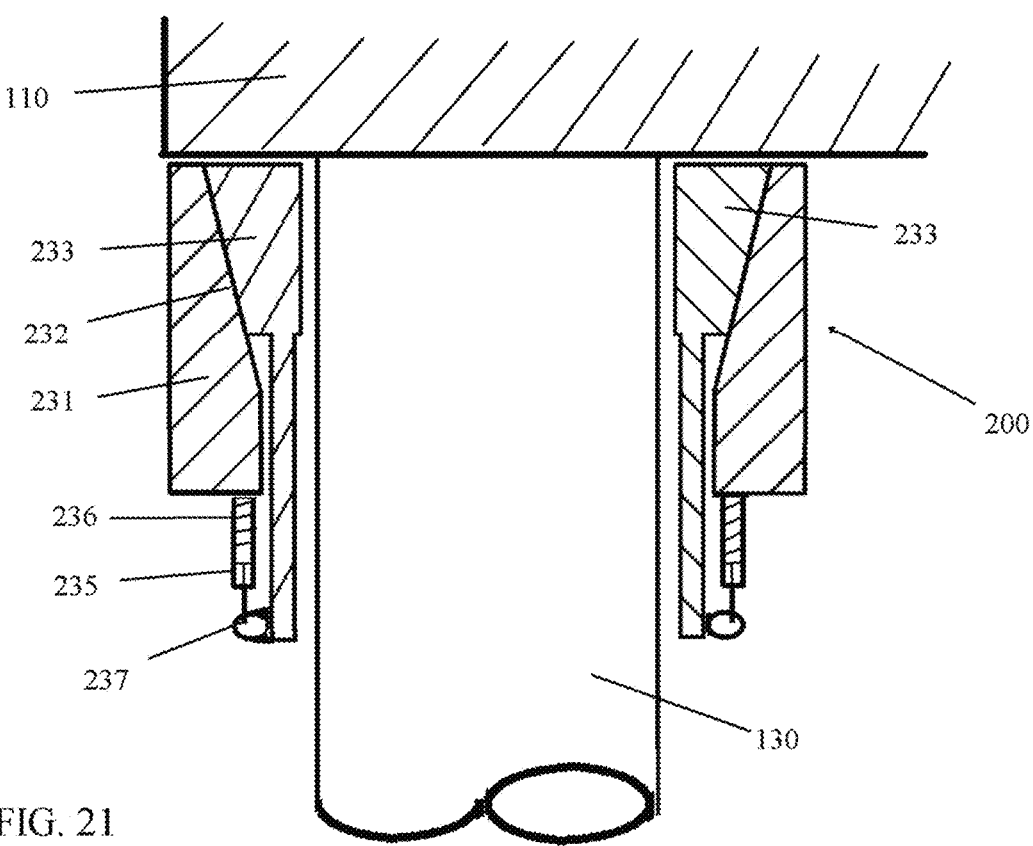
FIG. 21 illustrates a schematic view of a first arrangement of a fail-safe brake on the support legs.
Figure 22:
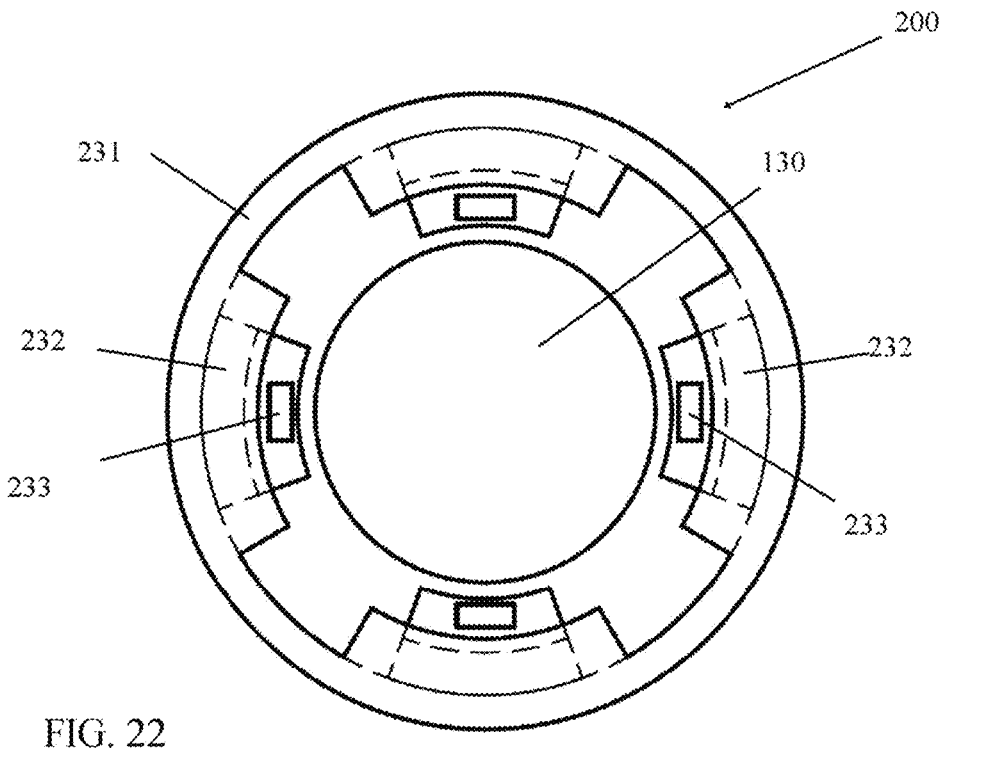
FIG. 22 illustrates a sectional schematic view of the first arrangement of the fail-safe brake depicted in FIG. 21.
Figures 23, 24:
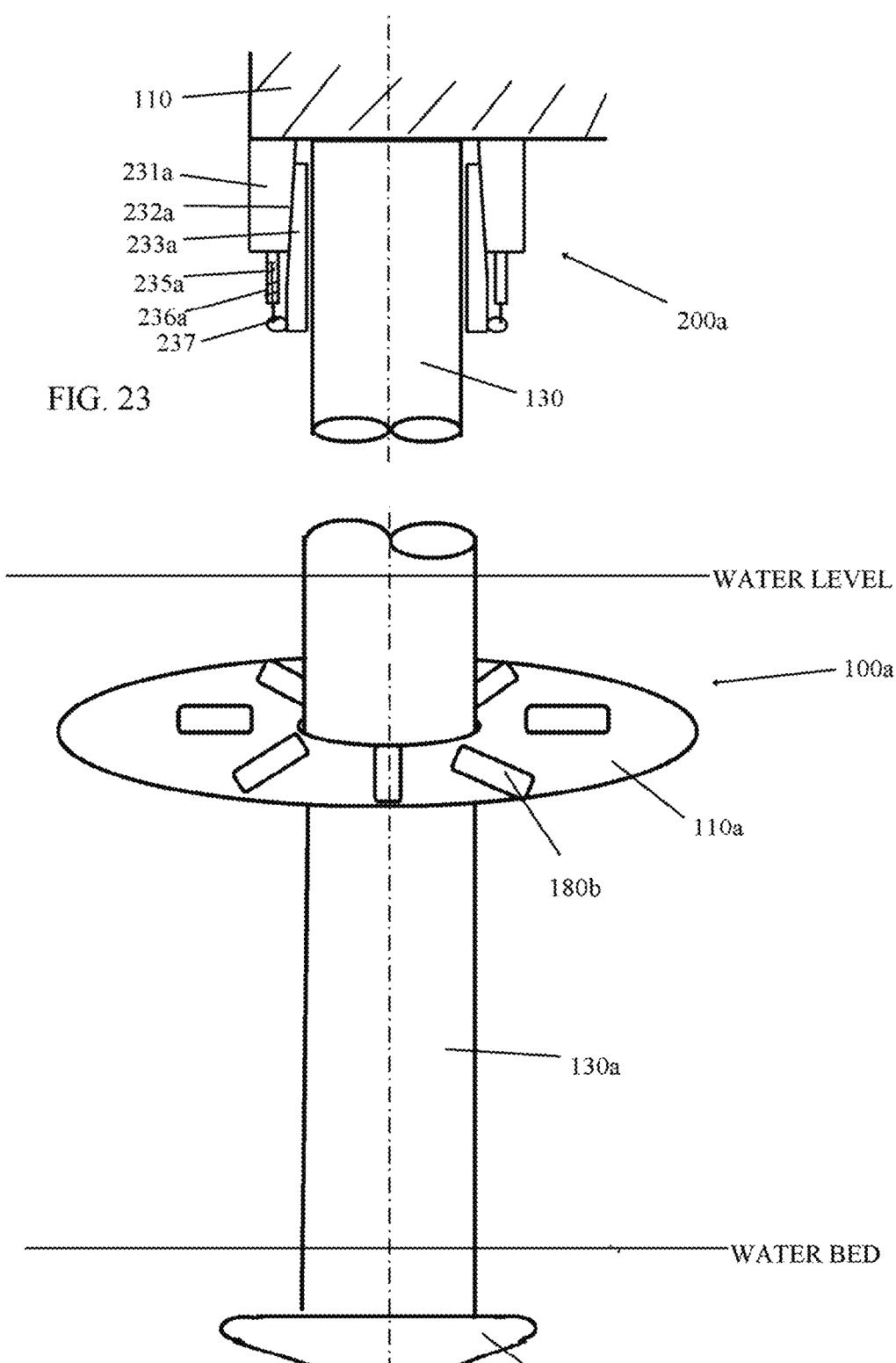
FIG. 23 illustrates a second schematic view of a second arrangement of a fail-safe brake on the support legs.
FIG. 24 illustrates a schematic view of a part of a submersible data center located on a submersible platform according to an alternative embodiment of the present invention.

FIGS. 21 and 23 show two variations of the fail-safe brakes 200, 200*a*. In FIGS. 21 and 23, four wedge members 233, 233*a* are used to illustrate the fail-safe brakes 200, 200*a* but the numbers are not so restricted. In FIG. 21, the wedge members 233 are operable to slide on the respective slot surfaces 232 by the linear actuator 235, with the connector 237 connecting the linear actuator 235, 235*a* to the respective wedge members 233, 233*a*. In one embodiment, the linear actuator 235 is equipped with an internal spring 236 that extends the linear actuator 235 during abnormal operation, such as, during a power failure or abnormal sliding of the platform 110 on the support legs 130. During normal operation, the linear actuator 235 is retracted and the fail-safe brake 200 becomes non-operative. FIG. 22 shows a view of the fail-safe brake 200 in the axial direction along the support leg 130. In FIG. 23, wedge members 233*a* and the respective slot surfaces 232*a* are inclined differently from the above, and the linear actuator 235*a* is thus retracted to activate the fail-safe brake 200*a* during abnormal operation. In one embodiment, the linear actuator 235*a* is equipped with an internal spring 236*a* at the rod side to retract when not being actuated. If the internal springs 236, 236*a* are not used, then the linear actuators must be accordingly actuated during fail-safe braking, for e.g., as assisted by fluid pressure accumulators and fluid brake valves.

FIG. 24 shows a part of an elevator apparatus 100*a* with a submersible platform 110*a* being supported by a single support leg 130*a* according to another embodiment. FIG. 24 is used for illustration and does not show the winches to launch the support leg 130*a* or to slide the platform 110*a* on the support leg 130*a*. The winches, wire ropes and other components described above are applicable on the elevator apparatus 100*a*. However, for illustration, the platform 110*a* is circular in outline and supports some data center capsules 180*c*, which may be similar to or different from the above data center capsules 180, 180*b*.

In use of the above described data centers, it is possible that a data center capsule 180, 180*a*, 180*b* is employed as a digital twin to backup contents of an associated data center capsule, for e.g., for purposes of data security. With the digital twin, it is now possible to compare and to monitor the health of each of the data center. In addition, the data center capsules 180, 180*a*, 180*b* are equipped with a thermal management artificial intelligent (AI) module 310 to monitor the temperature profiles of the data center equipment. The thermal management AI module 310 can thus be used to intelligent distribute cooling liquids or refrigerants for improving thermal efficiency and efficiency of the cooling loads. The thermal management AI module 310 can also be used to generate preventive maintenance of the data center equipment.

In another embodiment, a structural model of the elevator apparatus is created to monitor structure integrity and maintenance. For e.g., strain sensors 322 are located at strategic locations on the elevator apparatus 100, 100*a*, motion sensors 324 at the fail-safe brakes, sensors 326 at the winches, environmental sensors 328 (such as, for wind and wave forces), fuel sensors 330 located in the fuel compartments 164, and other allied sensors, etc., are connected to a structural artificial intelligent (AI) module 320, which provides structural monitoring, safe operating or preventive maintaining of the elevator apparatus 100, 100*a*.

While specific embodiments have been described and illustrated, it is understood that many changes, modifications, variations and combinations of variations disclosed in the text description and drawings thereof could be made to the present invention without departing from the scope of the present invention. For e.g., the submersible platform 110 and the support legs 130 may be fabricated as latticed-structures without affecting the structural strengths or the above-described functionalities. In addition, the support legs 130 need not be circular in cross-section; it can be triangular or polygonal in cross-section. The number of support legs 130 is also not restricted to 1 or 3 numbers, as illustrated above. Similarly, the submersible platform 110 can be of any shape in outline. Whilst the elevator apparatus 100 has been described, it is possible to install a plurality of the elevator apparatuses together, for example, and are organized like a data center farm or park.

What is claimed is:

1. A submersible data center mountable on an elevator apparatus comprising:
   a submersible platform operable to slide relatively on a support leg or a plurality of support legs;
   a data center capsule mounted on or mounted partially inside the submersible platform; and
   a winch located near a top end of each of the support leg or plurality of the support legs;
   wherein the winches are operable to hoist or to lower the submersible platform between a first position located near an upper end of the support leg or plurality of the support legs that is above a water level and a second position located near a distal end of each of the support leg or plurality of the support legs, so that the data center capsule is operational when the submersible platform at the second position is submerged in a body of water.

2. The apparatus according to claim 1, further comprising:
   locking pins that are operable to engage into cooperating holes formed on both the submersible platform and the support leg or the plurality of support legs to locate the submersible platform on the support leg or the plurality of support legs at the first or the second position.

3. The apparatus according to claim 2, further comprising:
   a generator located above each of the winches to supply electric power to the elevator apparatus.

4. The apparatus according to claim 3, further comprising:

a leg-lowering winch associated with the support leg or each of the plurality of the support legs, wherein the leg-lowering winch is located on the submersible platform and are operable for a first-time deployment of the support leg or support legs into a waterbed at the bottom of the body of water.

5. The apparatus according to claim 4, further comprising:

a spudcan disposed at a distal end of the support leg or each of the plurality of the support legs, with the spudcans allowing the support leg or plurality of the support legs to settle stably into the waterbed and to support the elevator apparatus.

6. The apparatus according to claim 1, further comprising:

a heat exchanger, a chiller or a centralized chiller for dissipating heat energy from inside the data center capsule to a surrounding water.

7. The apparatus according to claim 6, wherein the data center capsule includes a thermal management artificial intelligent module to monitor a temperature profile inside each data center and to distribute cooling fluids or refrigerants to the heat exchanger, chiller or centralized chiller for improved cooling efficiency.

8. The apparatus according to claim 1, wherein the data center capsule is removably mounted onto the submersible platform by fixing connectors.

9. The apparatus according to claim 1, wherein the submersible platform is configured with sleeves to guide sliding motion with the respective support legs, and wherein each of the sleeves is formed with a tapered slot surface matching a wedge member to provide a fail-safe brake mechanism.

10. The apparatus according to claim 9, further comprising:

a motion sensor located near the fail-safe brake, wherein during detection of an abnormal speed of sliding, the motion sensor is configured to activate the fail-safe brake to stop sliding of the submersible platform on the respective support leg or support legs.

11. The apparatus according to claim 10, further comprising:

a structural artificial intelligent module, to which strain sensors, leg motion sensors, winch sensors, environment sensors are connected thereto for structural integrity monitoring, safe operating and/or preventive maintenance.

12. A method for operating an underwater data center, comprising the steps of:

locating a data center capsule on an elevator apparatus, which is configured with a submersible platform; and operating the submersible platform to slide on a support leg or plurality of cooperating support legs between a first position located near an upper end of the support leg or plurality of the support legs that is above a water level and a second position located near a distal end of each of the support leg or plurality of the support legs by hoisting or lowering the submersible platform with a winch located at a top of the support leg or each of the plurality of the support legs, so that the data center capsule is operational when the submersible platform at the second position is submerged in a body of water.

13. The method according to claim 12, further comprising the step of locating the submersible platform on the support leg or plurality of the support legs with a plurality of locking pins.

14. The method according to claim 12, further comprising the step of:

transferring heat energy from an inside of the data center capsule to the surrounding body of water with a heat exchanger, a chiller or a centralized chiller.

15. The method according to claim 14, further comprising the step of:

disposing a leg-lowering winch associated with the support leg or each of the plurality of the support legs, wherein the leg-lowering winch is operable for a first-time to deploy the plurality of the support legs into a waterbed at the bottom of the body of water.

16. The method according to claim 15, further comprising the steps of:

towing the elevator apparatus to an installation site with a barge; and supplying electric power from the barge to controllably operate the leg-lowering winch for the first-time deploying of the support leg or plurality of the support legs.

\* \* \* \* \*